(12) United States Patent
Afrough et al.

(10) Patent No.: US 11,486,813 B1
(45) Date of Patent: Nov. 1, 2022

(54) METHOD AND SYSTEM FOR DETERMINING CONFINEMENT SIZE IN POROUS MEDIA

(71) Applicant: University of New Brunswick, Fredericton (CA)

(72) Inventors: Armin Afrough, Fredericton (CA); Bruce J. Balcom, Fredericton (CA); Laura Romero-Zerón, Fredericton (CA)

( * ) Notice: Subject to any disclaimer, the term of this patent is extended or adjusted under 35 U.S.C. 154(b) by 139 days.

(21) Appl. No.: 16/707,407

(22) Filed: Dec. 9, 2019

Related U.S. Application Data

(60) Provisional application No. 62/779,714, filed on Dec. 14, 2018.

(51) Int. Cl.
*G01N 15/10* (2006.01)
*G01N 27/72* (2006.01)
*G01N 15/00* (2006.01)

(52) U.S. Cl.
CPC ......... *G01N 15/1031* (2013.01); *G01N 27/72* (2013.01); *G01N 2015/0053* (2013.01); *G01N 2015/1087* (2013.01)

(58) Field of Classification Search
CPC ............... G01N 15/1031; G01N 27/72; G01N 2015/0053; G01N 2015/1087
USPC ........................................................ 324/200
See application file for complete search history.

(56) References Cited

U.S. PATENT DOCUMENTS

| 636,957 A | 11/1899 | Cusick | |
|---|---|---|---|
| 2001/0054894 A1* | 12/2001 | Goldfine | G01B 7/105 324/207.17 |
| 2017/0067969 A1* | 3/2017 | Butters | G01N 27/72 |

OTHER PUBLICATIONS

Song, Yi-Qiao. "Using internal magnetic fields to obtain pore size distributions of porous media." Concepts in Magnetic Resonance Part A: An Educational Journal 18.2 (2003): 97-110. (Year: 2003).*
Müller-Petke, Mike, et al. "Nuclear magnetic resonance average pore-size estimations outside the fast-diffusion regime." Geophysics 80.3 (2015): D195-D206. (Year: 2005).*
Song, Yi-Qiao. "Detection of the high eigenmodes of spin diffusion in porous media." Physical Review Letters 85.18 (2000): 3878. (Year: 2000).*
D.O. Seevers, a nuclear magnetic method for determining the permeability of sandstones, 7th Annual Logging Symp., 1966, 1-14, 7, Society of Petrophysicists and Well-Log Analysts, Tulsa.
Y. Song, detection of the high eigenmodes of spin diffusion in porous media, physical review letters, Oct. 30, 2000, 3878-3881, 85-18.
Y.Q. Song, S. Ryu, and P.N. Sen, determining multiple length in rocks, nature, 2000, 178-181, 406.

(Continued)

*Primary Examiner* — Christopher P McAndrew
(74) *Attorney, Agent, or Firm* — Eugene Derenyi

(57) ABSTRACT

Method and system for determining a confinement size in a porous media, including subjecting the media to a substantially uniform static magnetic field, applying a magnetic resonance pulse sequence to the media, detecting magnetic resonance signals from the media, determining non-ground eigenvalues from the magnetic resonance relaxation spectrum, and determining a confinement size of the media from the eigenvalues.

17 Claims, 3 Drawing Sheets

(56) References Cited

OTHER PUBLICATIONS

P.T. Callaghan, A. Coy, D. MacGowan, K.J. Packer, and F.O. Zelaya, diffraction-like effects in NMR diffusion studies of fluids in porous solids, nature, 1991, 467-469, 351.

P.T. Callaghan, A. Coy, T.P.J. Halpin, D. MacGowan, K.J. Packer, and F.O. Zelaya, diffusion in porous systems and the influence of pore morphology in pulsed gradient spin-echo nuclear magnetic resonance studies, journal of chemical physics, 1992, 651-662, 97-1.

H.C. Torrey, bloch equations with diffusion terms, physical review, 1956, 563-565, 104-3.

R.L. Kleinberg, nuclear magnetic resonance, experimental methods in the physical sciences, edited by P. Wong, 1999, 337-385, 35, Academic Press.

Y.Q. Song, L. Zielinski, and S. Ryu, two-dimensional NMR of diffusion systems, physical review letters, 2008, 248002-1-248002-4, 100-24.

Y.Q. Song, G. Carneiro, L.M. Schwartz, experimental identification of diffusive coupling using 2D NMR, physical review letters, 2014, 235503-1-235503-5, 113-23.

D.L. Johnson and L.M. Schwartz, analytic theory of two-dimensional NMR in systems with coupled macro- and micropores, physical review, 2014, 032407-1-032407-7, 90-3.

A.A. Behroozmand, K. Keating, and E. Auken, a review of the principles and applications of the NMR technique for near-surface characterization, surveys in geophysics, 2014.

M. Müller-Petke, R. Dlugosch, J. Lehmann-Horn, and M. Ronczka, nuclear magnetic resonance average pore-size estimations outside the fast-diffusion regime, geophysics, 2015.

S. Costable, C. Weidner, M. Müller-Petke, and G. Houben, hydraulic characterization of iron-oxide-coated and gravel based on nuclear magnetic resonance relaxation mode analyses, hydrology and earth system sciences, 2018, 1713-1729, 22.

J.H. Lee, C. Labadie, C.S. Springer, G.S. Harbison, J. Am. Chem. Soc., two-dimensional inverse laplace transform NMR: altered relaxation times allow detection of exchange correlation, 1993, 7761-7764, 115.

Y.Q. Song, L. Venkataramanan, M.D. Hürlimann, M. Flaum, P. Frulla, and C. Straley, T1-T2 correlation obtained using a fast two-dimensional laplace inversion, journal of magnetic resonance, 2002, 261-268, 154.

P.T. Callaghan, C.H. Arns, P. Galvosas, M.W. Hunter, Y. Qiao, and K.E. Washburn, recent fourier and laplace perspectives for multi-dimensional NMR in porous media, magnetic resonance imaging, 2007, 441-444, 25.

L. Venkataramanan, Y. Song, and M.D. Hürlimann, solving fredholm integrals of the first kind with tensor product structure in 2 and 2.5 dimensions, ieee transactions on signal processing processing, 2002, 1017-1026, 50-5.

K.R. Brownstein and C.E. Tarr, importance of classical diffusion in NMR studies of water in biological cells, physical review a, 1979, 2446-2453, 19-6.

G.C. Borgia, R.J.S. Brown, and P. Fantazzini, uniform-penalty inversion of multiexponenetial decay data, journal of magnetic resonance, 1998, 65-77, 132.

T.G. Kolda, R.M. Lewis, and V. Torczon, optimization by direct search: new perspectives on some classical and modern methods,SIAM Review, 2003, 385-482, 45-3, society for industrial and applied mathematics.

M.D. Hürlimann, K.G. Helmer, L.L. Latour, and C.H. Sotak, restricted diffusion in sedimentary rocks. determination of surface-area-to-volume ratio and surface relaxivity, journal of magnetic resonance, series a, 1994, 169-178.

Z.X. Luo, K. Paulsen, and Y.Q. Song, robust determination of surface relaxivity from nuclear magnetic resonance DT2 measurements, journal of magnetic resonance, 2015, 146-152, 259.

M. Freire-Gormaly, J.S. Ellis, H.L. MacLean, and A. Bazylak, pore structure characterization of indiana limestone and pink dolomite from pore network reconstructions, oil and gas science and technology—rev. IFP energies nouvelles, 2016, 71, 33.

Y. Ji, P. Baud, V. Vajdova, and T.-f. Wong, characterization of pore geometry of indiana limestone in relation to mechanical compaction, oil and gas science and technology—rev. IFP energies nouvelles, 2012, 753-775, 67-5.

D. Bradley and G. Roth, adaptive thresholding using the integral image, journal of graphic tools, 2007, 13-21, 12-2.

T.C. Lee R.L. Kashyap, and C.N. Chu, building skeleton models via 3-D medial surface/axis thinning algorithms, CVGIP:Graphical Models and Image Processing, 1994, 462-478.

J. Mitchell, T.C. Chandrasekera, D.J. Holland, L.F. Gladden, and E.J. Fordham, magnetic resonance maging in laboratory petrophysical core analysis, physics reports, 2013, 165-225, 526.

J. Mitchell, L.F. Gladden, T.C. Chandrasekera, and E.J. Fordham, low-field permanent magnets for industrial process and quality control, progress in nuclear magnetic resonance spectroscopy, 2014, 1-60, 76.

* cited by examiner

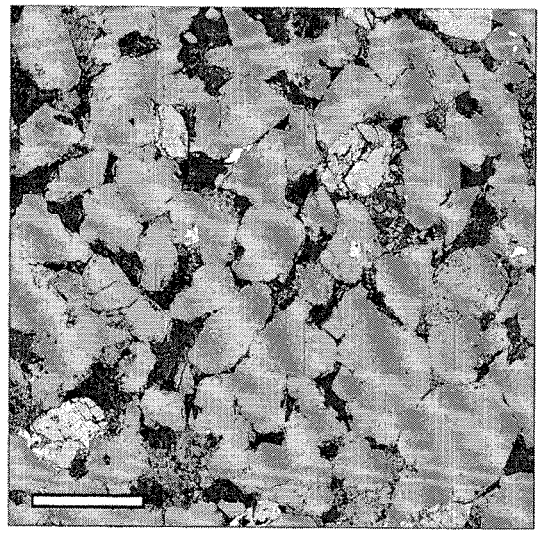
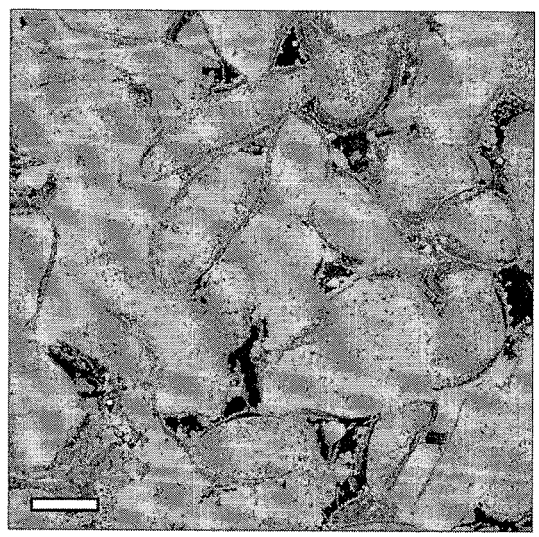
FIG. 1a  FIG. 1b
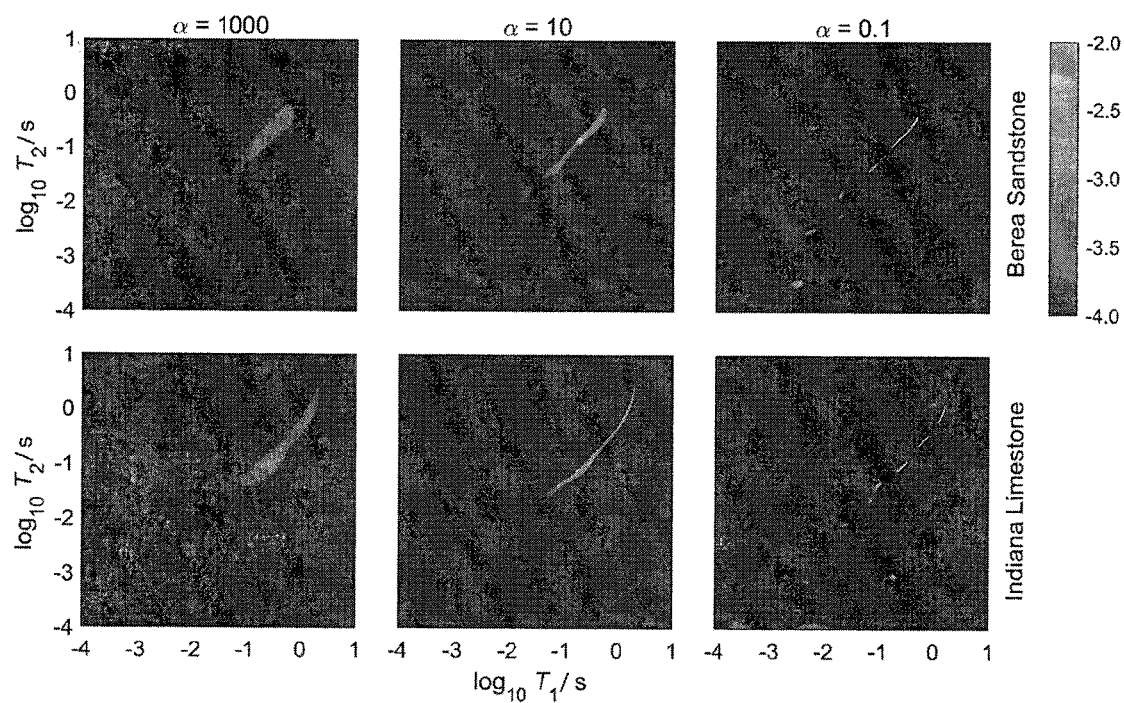
FIG. 2

METHOD AND SYSTEM FOR DETERMINING CONFINEMENT SIZE IN POROUS MEDIA

CROSS-REFERENCE TO RELATED APPLICATIONS

This application claims the benefit, under 35 U.S.C. § 120 of U.S. Provisional Patent Application Ser. No. 62/779,714, filed Dec. 14, 2018.

FIELD OF THE DISCLOSURE

The present disclosure relates to the field of magnetic resonance measurements in general, and to using magnetic resonance measurements for determining characteristics of porous media in particular.

BACKGROUND OF THE DISCLOSURE

Confined fluids are ubiquitous in nature and in technological materials. Water in cytosol, geological formations, soil, cement, and wood are but a few examples. Diffusion of spins in porous materials, with an eigenfunction expansion and diffusion propagator, provides information on the surface-to-volume ratio [1], pore size [2,3], periodicity [4,5], and length scales [3] of fluid confinements. The evolution of magnetization M(r,t) in a fluid with scalar self-diffusivity D is governed by the Bloch-Torrey equation [6]:

$$\left(\frac{\partial}{\partial t} - D\nabla^2 + \frac{1}{T_{2b}}\right) M_+(r, t) = 0 \quad (1)$$

in the transverse plane, where $M_+ = M_x + iM_y$, and $$\left(\frac{\partial}{\partial t} - D\nabla^2 + \frac{1}{T_{1b}}\right) M_z(r, t) = \frac{M_0}{T_{1b}} \quad (2)$$

in the direction of the static magnetic field. In the above equations, $M_0$ is the equilibrium magnetization of confined fluid with bulk longitudinal and transverse relaxation time constants $T_{1b}$ and $T_{2b}$, respectively. $T_1$ and $T_2$ are the exponential decay constants of $M_z$ and $M_+$ to $M_0$ and 0, respectively.

Due to enhanced magnetization relaxation at wetted surfaces by homonuclear dipole-dipole coupling, cross-relaxation by other nuclear spins, relaxation by free electrons and paramagnetic ions [7], Eqs. (1-2) are subject to Fourier boundary conditions:

$$(D\hat{n} \cdot \nabla + \rho_2) M_+(r,t) = 0, \quad (3)$$

and $$(D\hat{n} \cdot \nabla + \rho_1) M_z(r,t) = 0, \quad (4)$$

where $\rho_1$ and $\rho_2$ are longitudinal and transverse surface relaxivities, respectively. In general, self diffusivity will be a tensor and $\rho_1$ and $\rho_2$ may be heterogenous; however, they are treated as constant scalars here.

Simple magnetic resonance experiments in porous media typically commence with a homogeneous magnetization such as $M_z(r,t) = -M_0$ or $M_+(r,t) = M_0$. Previous attempts to extract the system geometry and parameters of magnetic resonance relaxation in porous media from Eqs. (1-2), largely the work of Y. Q. Song and coworkers [2,3], have been focused on creating an inhomogeneous magnetization by employing internal magnetic field gradients to significantly accentuate the non-ground eigenstates. Recent efforts [8-10] have been directed at diffusive coupling between different environments and provided compelling evidence (for example see [9]) that non-ground eigenstates contribute to 1 D and 2D magnetic resonance relaxation data. Other researchers [11-13] have also recognized the contribution of non-ground eigenvalues to magnetic resonance relaxation in porous media. However, these workers have not fully explored the application of this phenomenon in magnetic resonance measurements.

BRIEF DESCRIPTIONS OF DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 1a and FIG. 1b are backscattered electron scanning microscopy images of resin-impregnated Berea sandstone (FIG. 1a) and Indiana limestone (FIG. 1b) with polished surfaces;

FIG. 2 are images of two-dimensional relaxation correlation functions $I(T_{1,p}, T_{2,q})$ for brine-saturated Berea sandstone (top images) and Indiana limestone (bottom images) at $B_0 = 0.05$ T and regularization parameters of $\alpha = 1000$, 10, and 0.1;

DETAILED DESCRIPTION

The present inventors, in one embodiment of the present invention, have discovered the importance of non-ground eigenvalues and their contribution to the relaxation of initially homogeneous magnetization by longitudinal and transverse 1H relaxation processes in porous materials. The porous media can include rocks, such as rocks from underground formations and reservoirs, and porous materials of technological importance such as wood and cement. The present invention in another embodiment relates to characterizing complex pore geometries in natural samples including biological samples such as biological tissue.

The present invention in one embodiment relates to a method of using magnetic resonance relaxation measurements to characterize pore geometries in materials, such as confinement size in fluid occupied porous materials.

The present invention in another embodiment relates to a method of using uniform magnetization in natural porous media resulting in non-ground eigenvalues detected by magnetic resonance relaxation measurements.

Figure 5:
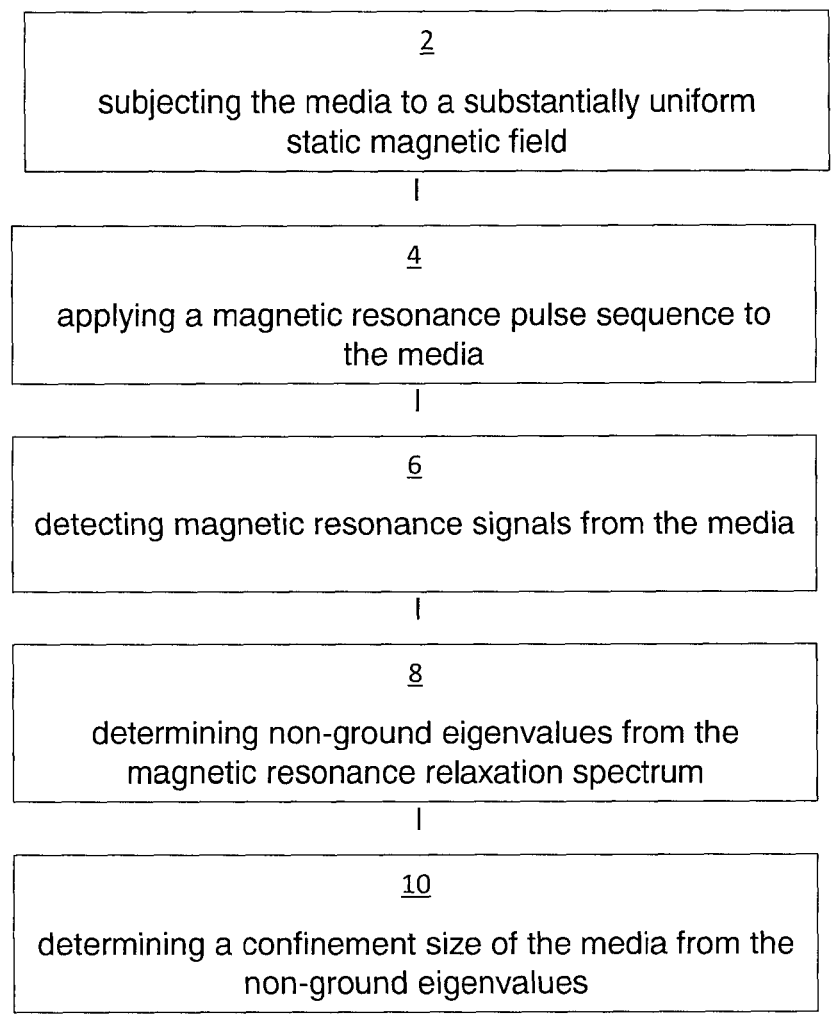
FIG. 5 is a flow chart of a method according to an aspect of the present disclosure.

With reference to FIG. 5, the present invention in another embodiment relates to a method of determining a confinement size in a porous media, including the steps of subjecting the media to a substantially uniform static magnetic field (step 2), applying a magnetic resonance pulse sequence to the media (step 4), detecting magnetic resonance signals from the media (step 6), determining non-ground eigenvalues from the magnetic resonance relaxation spectrum (step 8), and determining a confinement size of the media from the non-ground eigenvalues (step 10).

The present invention in another embodiment relates to a system for determining a confinement size in a porous media, the system including a magnetic resonance measurement system adapted and configured to make magnetic resonance measurements of a porous media and to generate therefrom magnetic resonance data; and a processing system programmed and configured to determine non-ground eigenvalues from the magnetic resonance relaxation spectrum, and generate a confinement size of the media from the eigenvalues.

In some embodiments of the present invention, magnetic resonance relaxation measurements are 1 D magnetic resonance relaxation measurements. In other embodiments, the magnetic resonance relaxation measurements are 2D magnetic resonance relaxation measurements. In still further embodiments, the magnetic resonance relaxation measurements are 3D magnetic resonance relaxation measurements. In still further embodiments, the magnetic resonance relaxation measurements are one or multi-dimensional magnetic resonance or magnetic resonance imaging measurements in porous media that have at least one relaxation dimension. In some embodiments of the present invention, a distinctive pattern can be generated from these eigenvalues and the distinctive pattern can be used to identify and characterize multiple pore sizes.

The present inventors, in another embodiment of the present invention, have discovered that non-ground eigenstates contribute to longitudinal and transverse $^1$H magnetic resonance relaxation measurements with homogeneous magnetization in porous materials. In one embodiment, the present invention relates to a method of processing a 2D relaxation measurement of $T_1$ and $T_2$ to yield an absolute confinement size. While the ground eigenstate dominates the diffusion of spins, non-ground eigenstates may be observed with a much-reduced intensity; in some embodiments the first, in other embodiments the second, and in still other embodiments, higher than the second, non-ground eigenvalues may be observed in relaxation data. The distinctive pattern of such eigenvalues makes it possible to recognize them in porous materials, even with multiple pore sizes.

The existence of non-ground eigenstates in magnetic resonance measurements of homogeneous magnetization can be used in porous media measurement methods according to embodiments of the present invention. In other embodiments according to the present invention, reprocessing of a very large body of extant magnetic resonance measurements can be carried out. In the method according to one embodiment of the present invention, $T_1$-$T_2$ relaxation correlation measurements are used.

The $T_1$-$T_2$ magnetic resonance relaxation correlation experiment [14,15] provides rich information on pore fluid dynamics. The $T_1$-$T_2$ method is analyzed by two-dimensional multi-exponential analysis [16] and can simultaneously characterize multiple eigenvalues of the system.

Radiofrequency (rf) pulses applied at the Larmor frequency $$f = \frac{\gamma}{2\pi} B_0$$

of $^1$H rotates the sample magnetization vector into the transverse plane where it may be observed by inducing a voltage in the probe. The $T_1$-$T_2$ method is composed of a $T_1$ encoding segment and a $T_2$ encoding segment:

$$\underbrace{\left[\pi - \tau_1 - \frac{\pi}{2}\right]}_{T_1 \text{ encoding}} \underbrace{[-(\tau_i - \pi - \tau_i)_N]}_{T_2 \text{ encoding}}. \tag{5}$$

The $T_1$ encoding commences with a 180° pulse followed by a waiting period $\tau_1$ and a 90° pulse. $T_2$ information is imparted by the second segment with 180° pulses, with a time spacing of $2\tau_1$, and a phase shift of 90° compared to other rf pulses. Spin echoes form between refocusing 180° pulses in the second segment at $\tau_2 = 2k\tau_1$ with $1 < k \leq N$, where $\tau_2$ is time beginning in the second segment.

By varying the $\tau_1$ encoding period P times and keeping $\tau_i$ and N constant, the measurement of Eq. (5) acquires time-domain relaxation correlation information as a P×N matrix $m_+(\tau_1, \tau_2)$ where only spin echoes are acquired by the rf coil. The magnetization $m_+$ acquired by the rf coil is equal to:

$$m_+(\tau_1, \tau_2) = \int_r M_+(r, \tau_1, \tau_2) dr, \tag{6a}$$

$$= \sum_{q=0}^{\infty} \sum_{p=0}^{\infty} I(T_{1,p}, T_{2,q}) e^{-\tau_1/T_{1,p}} e^{-\tau_2/T_{2,q}}, \tag{6b}$$

where the deviation of signal from equilibrium is normalized in the longitudinal direction. An inverse two-dimensional Fredholm integral of the first kind transforms the measured signal $m_+(\tau_1, \tau_2)$ into a 2D relaxation correlation function $I(T_{1,p}, T_{2,q})$ from which eigenvalues of magnetic resonance relaxation may be identified [17]. Equations (6a) and (6b) assume the rf coil is uniformly sensitive within the sample space.

Brownstein-Tarr numbers:

$$BT_i = \frac{\rho_i l}{D} \tag{7}$$

represent the ratio of magnetization relaxation rate at domain boundaries to the rate of mass diffusivity in a confined geometry with characteristic length l. i equals 1 or 2 for longitudinal and transverse relaxation, respectively. $BT_i$ set the diffusion or surface relaxation dependence of relaxation time constants represented in $I(T_{1,p}, T_{2,q})$. In simple geometries, and for arbitrary $BT_i$ values, the eigenvalues of magnetization evolution in a confined environment are $$T_{i,n} = \frac{l^2}{4D\xi_{n,i}^2}, \tag{8}$$

where $\xi_{n,i}$ are functions of confinement geometry, diffusion coefficient, eigenvalue number n, and $BT_i$. In a planar pore geometry [18], $\xi_{n,i}$ are the positive roots of $$2\xi_{n,i} \tan \xi_{n,i} = BT_i. \tag{9}$$

Equations (7-9) are valid for planar geometries for both ground n=0 and non-ground n>0 eigenvalues and for longitudinal i=1 and transverse i=2 relaxation processes. Equation (9) can be replaced with other equations to describe eigenvalues for other geometries, including, but not limited to, cylindrical and spherical geometries.

Two geological samples, Berea sandstone and Indiana limestone, with different pore geometries and constitutive minerals demonstrate the distinctive pattern of eigenvalues in simple longitudinal and transverse $^1$H magnetic resonance relaxation measurements. We show that simple magnetic resonance relaxation measurements can measure the absolute value of the confinement size.

The Berea sample used in these examples was an Upper Devonian sandstone from the Kipton formation, a grain-supported rock with quartz, feldspar, and micaceous clay minerals that has a porosity of 0.20. The pore size mode from microscopy was 26 μm with a pore size distribution that was log-normal.

Referring to FIG. 1a and FIG. 1b, the Indiana limestone sample has a grain-dominated fabric, made up of fossil fragments and oolites, with calcite cement. In FIG. 1a and FIG. 1b, resin-filled pore space is black. In the sandstone sample of FIG. 1a, quartz is medium gray, feldspar is light gray, and clay is dark gray. Virtually all of the limestone is composed of calcite. Indiana limestone (see FIG. 1b) features small calcite crystals lining the pore surface and intraparticle porosity in some grains. The limestone sample of FIG. 1b features a bimodal pore size distribution in backscattered electron microscopy images with a porosity of 0.15. The large and small pore modes are 50 m and 10.1 m, respectively; both from electron microscopy.

The regularization parameter a employed in the inverse Fredholm integral transformation of the 2D relaxation correlation function $I(T_{1,p}, T_{2,q})$ can cause significant blurring of eigenvalues. However, a proper choice of the regularization parameter will demonstrate multi-modal features of $I(T_{1,p}, T_{2,q})$. Such 2D relaxation correlation functions for Berea sandstone and Indiana limestone at $B_0$=0.05 T are shown in FIG. 2. The $I(T_{1,p}, T_{2,q})$ data, in FIG. 2, is shown in $\log_{10}$-scale to enhance the visibility of low-probability eigenvalues. The regularization parameter for the multiexponential analysis of relaxation measurements were varied over seven orders of magnitude, with three examples shown in FIG. 2. Eigenvalues of magnetization relaxation are labeled as Exy; where E determines the environment, and x and y are eigenstate numbers respectively for $T_{1,x}$ and $T_{2,x}$; P represents water in pores of Berea sandstone, and L and S represent water in large and small pores of Indiana limestone, respectively. Only the gross features of $I(T_{1,p}, T_{2,q})$ are observed with large regularization parameters which indicate ground eigenvalues. However, with a decrease in the regularization parameter, low-intensity non-ground eigenvalues of the diffusion-relaxation system, such as P11, P22, L11, and S11 emerge. N0 and N1 are diffusion-relaxation eigenvalues related to $^1$H that do not experience the effect of pore walls and demonstrate bulk-like behavior in the $T_1$ domain. Peak splitting is another important feature of variation of the regularization parameter in FIG. 2. This is a common feature of algorithms employed in multiexponential analysis [19]. In such cases a single broad peak may break into smaller peaks, as observed for the unimodal Berea sandstone in FIG. 2, P00.

FIG. 2 comprises images of two-dimensional relaxation correlation functions $I(T_{1,p}, T_{2,q})$ for brine-saturated Berea sandstone (top images) and Indiana limestone (bottom images) at $B_0$=0.05 T and regularization parameters of α=1000, 10, and 0.1. An intensity range of $10^{-4}$ to $10^{-2}$ is mapped to black and to white, respectively on a grey scale, using a logarithmic scale to reveal small eigenvalues. Only ground eigenvalues are visible at α=1000. Non-ground eigenvalues emerge at α=10 and 0.1. Wide ground-state peaks split at small regularization parameters [19]. P00, P11, and P22 are the first three eigenvalues of magnetization relaxation in Berea sandstone. In the case of Indiana limestone S and L respectively represent eigenvalues of small and large pores. N marks signals that demonstrates bulk-like features in the $T_1$ domain.

A direct search optimization method [20] varied $\log_{10}$l/μm, $\log_{10}$ $\rho_1$/(μm/s), and $\log_{10}$ $\rho_2$/(μm/s) and solved Eqs. (7-9), for the planar geometry, to match the time constants of eigenvalues detected in $I(T_{1,p}, T_{2,q})$. Input parameters were all constrained in the range of $10^{-2}$ to $10^{-8}$ and had starting values of $10^{-6}$, $10^{-4}$, and $10^{-4}$. Eigenvalues calculated from Eq. (9) were corrected for bulk relaxation of two mass-percent NaCl solution at $B_0$=0.05 T, $T_{1b}$=3.07 s and $T_{2b}$=2.80 s.

While ground eigenvalues are easy to recognize, it's more difficult to identify non-ground eigenvalues. Ground eigenvalues were chosen from modes of $I(T_{1,p}, T_{2,q})$ at large regularization parameters and non-ground eigenvalues were chosen from smaller approximately diagonal peaks of 0.15 to 0.005 in intensity relative to the respective ground eigenvalue. In case an incorrect peak was chosen for the non-ground mode, the optimization algorithm failed to match the location of the peaks.

Figure 3A:
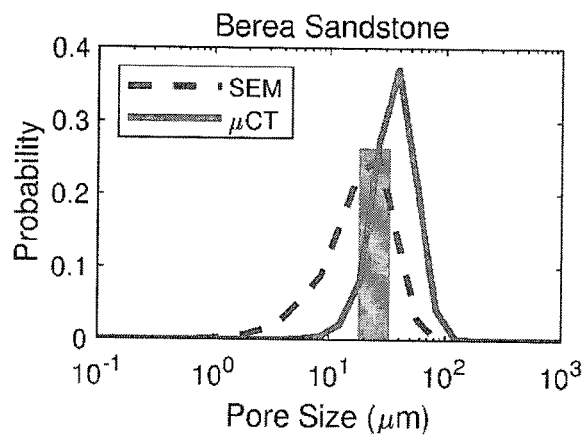
FIG. 3a and FIG. 3b are graphs of volumetric probability of pore diameter from scanning electron microscopy (- -) and X-ray micro-tomography (-) for the Berea sandstone sample of FIG. 1a and Indiana limestone sample of FIG. 1b.
Figure 3B:
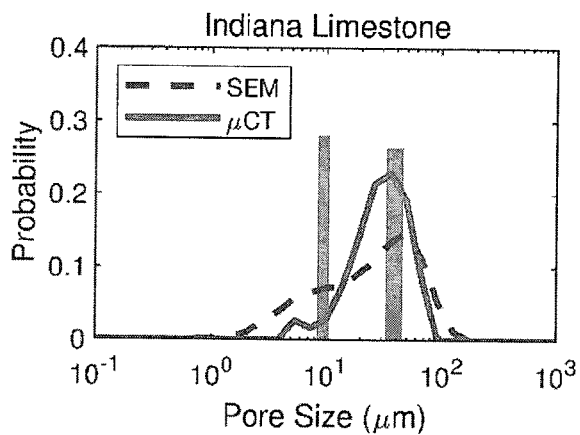

Referring to FIG. 3a and FIG. 3b, graphs of volumetric probability of pore diameter from scanning electron microscopy (- -) and X-ray micro-tomography (-) for Berea sandstone of FIG. 1a and Indiana limestone of FIG. 1b are shown. The pore size determined from magnetic resonance relaxation measurement by a direct search algorithm is shown as a gray rectangle. A pore diameter of 22.1 μm was computed for Berea sandstone and pore diameters of the large and small pores in Indiana limestone were estimated to be 39.6 μm and 10.0 m. The width of the rectangle shows the estimated size by varying the input parameters and the heights demonstrate relative pore size population.

The optimization method correctly matched the measured eigenvalues with liberal constraints for l, $\rho_1$, and ρ2. For Berea sandstone, this work predicted a 22.1 μm pore size; whereas the pore size from scanning electron microscopy and X-ray microtomography had modes of 26 μm and 39 μm, respectively. Berea sandstone had estimated surface relaxivity constants of $\rho_1$=138 μm/s and $\rho_2$=237 μm/s. The predicted pore size agrees with previously published results for surface-area-to-volume ratio of Berea sandstone [21]. Surface relaxivities of Berea sandstone calculated in this work are less than a factor of 10 different from those reported in the literature [21,22]. With samples used in this study, Eqs. (7-9) demonstrated a greater sensitivity to the pore size as opposed to surface relaxivities.

For Indiana limestone, the analytical method presented in this work estimated pore sizes of 10.0 μm and 39.6 μm for small and large pores, respectively. The pore sizes from processed scanning electron microscopy images were 10.1 μm and 50 μm for small and large pores, respectively. Indiana limestone had estimated surface relaxivity constants of $\rho_1$=64 μm/s and $\rho_2$=204 μm/s for small pores and $\rho_1$=60 μm/s and $\rho_2$=195 μm/s for large pores. Surface relaxivities of large and small pores are satisfactorily similar although they are acquired with two separate sets of eigenvalues. These results agree with previously published results for Indiana limestone pore size [23,24] and surface relaxivity of Indiana limestone is within the expected surface relaxivity range for sedimentary rocks [21].

$T_1$-$T_2$ measurements were performed with a $B_0$ static magnetic field of 0.05 T and 90° rf pulse lengths of 27 μs.

Measurements were undertaken at ambient temperature of 24° C. $\tau_1$ was varied logarithmically P=56 times, in the range of 0.1 ms to 15 s, and N=8125 echoes were acquired with $\tau_i$=125 µs or 300 µs. Each measurement was repeated four times for signal averaging and phase cycling with a repetition delay of 20 s. The measurement time for sandstone and limestone samples was 106 minutes and 156 minutes. The inverse integral transform method of [17] converted $m_+(\tau_1,\tau_2)$ to $I(T_{1,p},T_{2,q})$ with $T_{i,p}$ in the range of 1 µs to 10 s in 512 logarithmic steps. Logarithmic variation of the regularization parameter from 100000 down to 0.01 reduced blurring in $I(T_{1,p},T_{2,q})$ while maintaining the main features of $I(T_{1,p},T_{2,q})$. The regularization parameter was not reduced beyond 0.01 for normalized $m_+$ matrices. The signal-to-noise ratio of $m_+(\tau_1,\tau_2)$ was 168 and 123 for the Berea sandstone and Indiana limestone samples. Two-dimensional microscopy or 3D microtomography images were corrected by a median filter, binarized with adaptive thresholding [25] and reduced to skeletons [26]. The value of the distance transform at each skeleton voxel was regarded as its respective pore radius. After binning, pore size probabilities were corrected according to their volumetric contribution.

Figure 4:
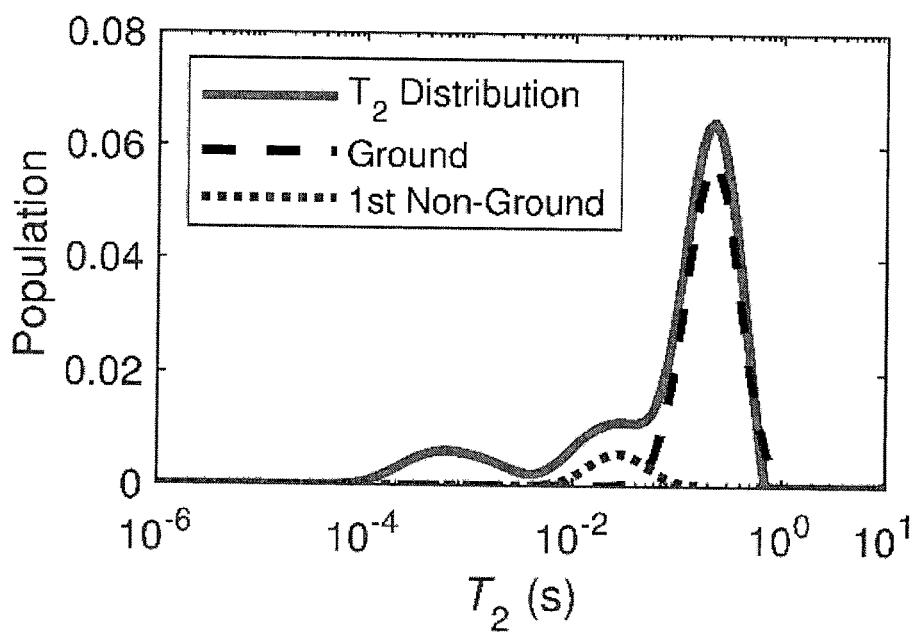
FIG. 4 is a graph of a $T_2$ distribution of Berea sandstone and its estimated ground and non-ground eigenvalues.

Observation of non-ground eigenvalues of magnetic resonance relaxation is also possible in $T_2$ or $T_1$ distributions measured by CPMG and inversion recovery methods with importance in petroleum laboratory measurements [27], well-logging [28], and industrial measurement and control [29]. It is usually assumed that non-ground eigenstates are not observed in $T_1$ and $T_2$ distributions and that these distributions are direct proxies for pore size. The present inventors have discovered that this is not the case and estimate pore size for unimodal-pore-size Berea sandstone from a single $T_2$ distribution, as shown in FIG. 4. Using an optimization method similar to the one described earlier, but only for the $T_2$ distribution, the pore diameter of Berea sandstone was estimated to be 33.9 µm, with a distribution in the range of 17 µm to 66 µm with $\rho_2$ on the order of hundreds of micrometers per second.

Referring to FIG. 4, a graph of a $T_2$ distribution of Berea sandstone and its estimated ground and non-ground eigenvalues is shown. The $T_2$ distribution (-) was measured using the CPMG method with an inter-echo spacing of 300 µs. Varying l and $\rho_2$ and using a planar geometry for solving eigenvalues of the relaxation-diffusion equation lead to estimated (- -) contributions to the $T_2$ distribution by the dominant ground eigenvalues and a smaller non-ground eigenvalue peak.

In all examples in the present disclosure, the observed intensities of the non-ground relaxation eigenvalues were slightly larger than those estimated. Brownstein and Tarr calculated the intensity of non-ground eigenvalues for planar, cylindrical, and spherical geometries and realized that the contribution of non-ground eigenvalues is larger for cylindrical and spherical geometries with the same $BT_i$ values [18]. The majority of the discrepancy between estimated and measured intensities of non-ground eigenvalues is due to the simple planar geometry assumed in this work.

Magnetic resonance relaxation measurements according to embodiments of the present invention can be carried using a conventional magnetic resonance apparatus or a conventional magnetic resonance imaging instrument, programmed with instructions for carrying out the measurements. The operations may be implemented in a set of software instructions which may be stored or embodied on a non-transitory computer readable media and be executed by the processing device. For instance the software instructions may be stored in a program/control section of a memory of the NMR spectrometer/MRI device and executed by the one or more processor units of the spectrometer/device. However it is equally possible to carry out the calculations on a device which is separate from the NMR spectrometer or MRI device, for example on a computer. The device and the computer may for example be arranged to communicate via a communication network or via some other serial or parallel communication interface. It should further be noted that, instead of using software instructions, the operation of the method may be implemented in a processing device in the form of dedicated circuitry of the device/computer such as in one or more integrated circuits, in one or more application-specific integrated circuits (ASICs) or field-programmable gate arrays (FPGAs), to name a few examples.

In another embodiment, the magnetic resonance apparatus can be a well-logging apparatus and methods of the present invention can be implemented in a well-logging apparatus.

REFERENCES

[1] D. O. Seevers, in *SPWLA 7th Annu. Logging Symp.* (Society of Petrophysicists and Well-Log Analysts, Tulsa, Okla., 1966), pp. 1-14.

[2] Y. Song, Phys. Rev. Lett. 85, 3878 (2000).

[3] Y. Q. Song, S. Ryu, and P. N. Sen, Nature 406, 178 (2000).

[4] P. T. Callaghan, A. Coy, D. MacGowan, K. J. Packer, and F. O. Zelaya, Nature (1991).

[5] P. T. Callaghan, A. Coy, T. P. J. Halpin, D. MacGowan, K. J. Packer, and F. O. Zelaya, J. Chem. Phys. (1992).

[6] H. C. Torrey, Phys. Rev. 104, 563 (1956).

[7] R. L. Kleinberg, in *Exp. Methods Phys. Sci. Vol.* 35, edited by P. Wong (Academic Press, 1999), pp. 337-385.

[8] Y. Q. Song, L. Zielinski, and S. Ryu, Phys. Rev. Lett. 100, 20 (2008).

[9] Y.-Q. Song, G. Carneiro, L. M. Schwartz, and D. L. Johnson, Phys. Rev. Lett. 113, 235503 (2014).

[10] D. L. Johnson and L. M. Schwartz, Phys. Rev. E-Stat. Nonlinear, Soft Matter Phys. (2014).

[11] K. Keating, Near Surf. Geophys. (2014).

[12] M. Müller-Petke, R. Dlugosch, J. Lehmann-Horn, and M. Ronczka, GEOPHYSICS (2015).

[13] S. Costabel, C. Weidner, M. Müller-Petke, and G. Houben, Hydrol. Earth Syst. Sci. (2018).

[14] J. H. Lee, C. Labadie, C. S. Springer, G. S. Harbison, J. H. Lee, C. Labadie, C. S. Springer, and G. S. Harbison, J. Am. Chem. Soc. (1993).

[15] Y. Q. Song, L. Venkataramanan, M. D. Hürlimann, M. Flaum, P. Frulla, and C. Straley, J. Magn. Reson. 154, 261 (2002).

[16] P. T. Callaghan, C. H. Arns, P. Galvosas, M. W. Hunter, Y. Qiao, and K. E. Washburn, Magn. Reson. Imaging (2007).

[17] L. Venkataramanan, Y. Song, and M. D. Hürlimann, Structure 50, 1017 (2002).

[18] K. R. Brownstein and C. E. Tarr, Phys. Rev. A (1979).

[19] G. C. Borgia, R. J. S. Brown, and P. Fantazzini, J. Magn. Reson. (1998).

[20] T. G. Kolda, R. M. Lewis, and V. Torczon, SIAM Rev. (2003).

[21] M. D. Hurlimann, K. G. Helmer, L. L. Latour, and C. H. Sotak, J. Magn. Reson. Ser. A (1994).

[22] Z. X. Luo, J. Paulsen, and Y. Q. Song, J. Magn. Reson. 259, 146 (2015).

[23] M. Freire-Gormaly, J. S. Ellis, H. L. MacLean, and A. Bazylak, Oil Gas Sci. Technol. (2015).

[24] Y. Ji, P. Baud, V. Vajdova, and T. -f. Wong, Oil Gas Sci. Technol.—Rev. d'IFP Energies Nouv. (2012).
[25] D. Bradley and G. Roth, J. Graph. Tools (2007).
[26] T. C. Lee, R. L. Kashyap, and C. N. Chu, CVGIP Graph. Model. Image Process. (1994).
[27] J. Mitchell, T. C. Chandrasekera, D. J. Holland, L. F. Gladden, and E. J. Fordham, Phys. Rep. 526, 165 (2013).
[28] G. Coates, L. Xiao, and M. Prammer, Haliburt. Energy Serv. (1999).
[29] J. Mitchell, L. F. Gladden, T. C. Chandrasekera, and E. J. Fordham, Prog. Nucl. Magn. Reson. Spectrosc. 76, 1 (2014).

What is claimed is:

1. A method of determining a confinement size in a porous media, comprising the steps of:
    subjecting the media to a substantially uniform static magnetic field,
    applying a magnetic resonance pulse sequence comprising a $T_1$ encoding segment and a $T_2$ encoding segment to the media,
    measuring magnetic resonance signals from the media,
    transforming the measured signals into a two-dimensional relaxation correlation function,
    identifying non-ground eigenvalues from the two-dimensional relaxation correlation function, and
    determining a confinement size of the media from the non-ground eigenvalues.

2. The method of claim 1, wherein the step of transforming the measured signals into a two-dimensional relaxation correlation function comprises using a data inversion.

3. The method of claim 2, wherein the non-ground eigenvalues are first and second non-ground eigenvalues.

4. The method of claim 3, wherein the first and second non-ground eigenvalues are identified by varying a regularization parameter employed in an inverse Fredholm integral transformation.

5. The method of claim 4, wherein the regularization parameter is varied by progressively decreasing the value of the regularization parameter.

6. The method of claim 5, wherein the step of determining the confinement size of the porous media from the non-ground eigenvalues comprises obtaining longitudinal and transverse surface relaxivity values from peaks in the non-ground eigenvalues and relating the longitudinal and transverse surface relaxivity values to the confinement size of the porous media.

7. The method of claim 1, wherein the porous media is a subterranean rock formation.

8. The method of claim 1, wherein the porous media is a core plug sample from a subterranean rock formation.

9. The method of claim 1, wherein the porous media is selected from the group consisting of wood, cement and biological tissue.

10. The method of claim 1, wherein the porous media is fluid occupied.

11. A system for determining a confinement size in a porous media, the system comprising:
    a magnetic resonance measurement system adapted and configured to
        make magnetic resonance measurements of a porous media and to generate therefrom magnetic resonance data; and
    a processing system programmed and configured to:
        transform the magnetic resonance data into a two-dimensional relaxation correlation function,
        identify non-ground eigenvalues from the two-dimensional relaxation correlation function, and
        determine the confinement size of the media from the non-ground eigenvalues.

12. The system of claim 11, wherein for transforming the measured signals into a two-dimensional relaxation correlation function, the processing system is further programmed and configured to invert the magnetic resonance data.

13. The system of claim 12, wherein the non-ground eigenvalues are first and second non-ground eigenvalues.

14. The system of claim 13, wherein for identifying the first and second non-ground eigenvalues, the processing system is further programmed and configured to vary a regularization parameter employed in an inverse Fredholm integral transformation.

15. The system of claim 14, wherein the processing system is further programmed and configured to vary the regularization parameter by progressively decreasing the value of the regularization parameter.

16. The system of claim 15, wherein for determining the confinement size of the porous media from the non-ground eigenvalues, the processing system is further programmed and configured to obtain longitudinal and transverse surface relaxivity values from peaks in the non-ground eigenvalues and relate the longitudinal and transverse surface relaxivity values to the confinement size.

17. The system of claim 16, wherein the system is implemented in a well logging apparatus.

* * * * *